US007619932B2

(12) United States Patent  (10) Patent No.: US 7,619,932 B2
Jones et al.  (45) Date of Patent: Nov. 17, 2009

(54) ALGORITHM FOR CHARGE LOSS REDUCTION AND VT DISTRIBUTION IMPROVEMENT

(75) Inventors: Gwyn Robert Jones, Sunnyvale, CA (US); Edward Franklin Runnion, Santa Clara, CA (US); Zhizheng Liu, San Jose, CA (US); Mark William Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 16 days.

(21) Appl. No.: 11/959,122

(22) Filed: Dec. 18, 2007

(65) Prior Publication Data

US 2009/0154251 A1  Jun. 18, 2009

(51) Int. Cl.
*G11C 11/34* (2006.01)
(52) U.S. Cl. .............................. 365/185.22; 365/185.24
(58) Field of Classification Search ............ 365/185.22, 365/185.24
See application file for complete search history.

(56) References Cited

U.S. PATENT DOCUMENTS 5,734,612 A * 3/1998 Yoshikawa ............. 365/185.13

2004/0186935 A1 * 9/2004 Bell et al. ..................... 710/72

* cited by examiner

*Primary Examiner*—Michael T Tran
(74) *Attorney, Agent, or Firm*—Eschweiler & Associates, LLC

(57) ABSTRACT

Methods and systems for accurately programming or erasing one or more memory cells on a selected wordline of a memory device are provided. In one embodiment, the memory device comprises a memory array, a threshold voltage measuring component configured to measure a threshold voltage of each memory cell on the selected wordline of the memory array, and an average threshold voltage determining component configured to determine an average threshold voltage result uniquely associated with the selected wordline, based on the measured threshold voltages. The memory device is configured to program one or more of the memory cells to a predefined program level relative to the determined average threshold voltage, or to erase memory cells of the selected wordline to the determined average threshold voltage. The method is particularly useful for multi-level flash memory cells to reduce charge loss while improving data reliability and Vt distributions of the programmed element states.

25 Claims, 10 Drawing Sheets

| Left element Status | Left element | Right element | Right element Status | | Read left element Case | Read right element Case |
|---|---|---|---|---|---|---|
| Blank | 1 | 1 | Blank | | 11 | 11 |
| Level 2 program | 2 | 1 | Blank | | 21 | 12 |
| Level 2 program | 2 | 2 | Level 2 program | | 22 | 22 |
| Level 2 program | 2 | 3 | Level 3 program | | 23 | 32 |
| Level 2 program | 2 | 4 | Level 4 program | | 24 | 42 |
| Level 3 program | 3 | 1 | Blank | | 31 | 13 |
| Level 3 program | 3 | 2 | Level 2 program | | 32 | 23 |
| Level 3 program | 3 | 3 | Level 3 program | | 33 | 33 |
| Level 3 program | 3 | 4 | Level 4 program | | 34 | 43 |
| Level 4 program | 4 | 1 | Blank | | 41 | 14 |
| Level 4 program | 4 | 2 | Level 2 program | | 42 | 24 |
| Level 4 program | 4 | 3 | Level 3 program | | 43 | 34 |
| Level 4 program | 4 | 4 | Level 4 program | | 44 | 44 |

Fig. 2B

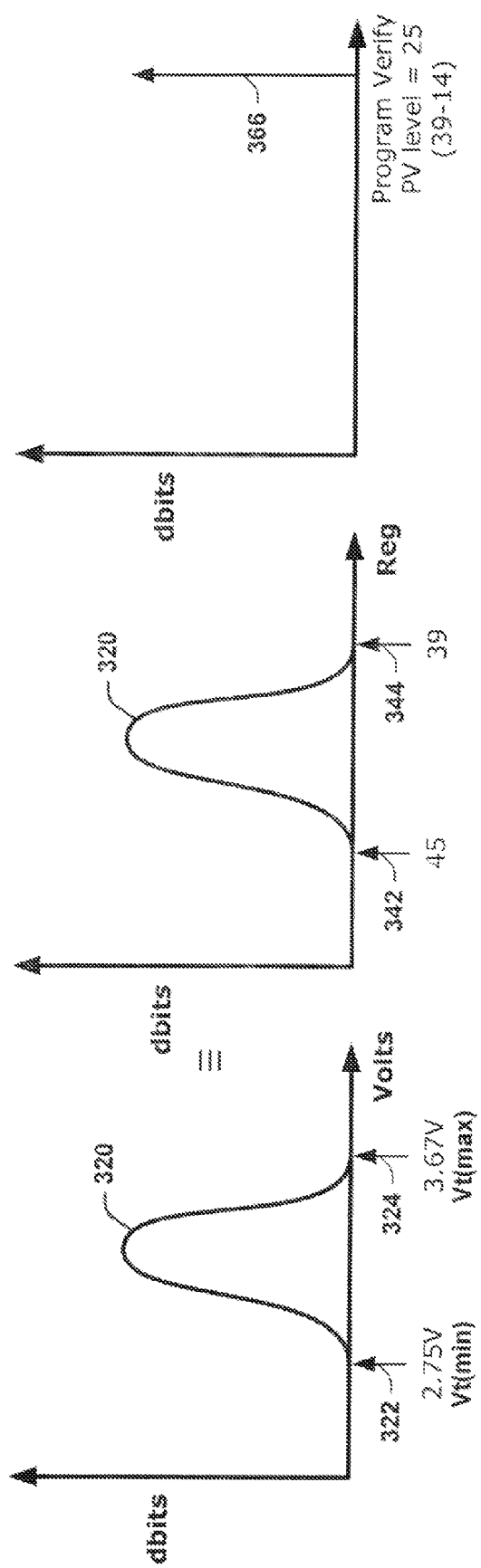

ALGORITHM FOR CHARGE LOSS REDUCTION AND VT DISTRIBUTION IMPROVEMENT

FIELD OF INVENTION

The present invention relates generally to memory devices and the like and in particular to a method of programming flash memory cells to reduce charge loss and improve Vt distribution in flash memory devices, and in the field of semiconductor fabrication of such devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual-bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the charge stored in the cell. The memory device includes appropriate circuitry to sense the resulting cell current in order to determine the charge stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. In operation, individual flash cells are addressed via the respective bitline and wordline using a peripheral decoder and control circuitry for programming (writing), reading or erasing functions. Erasing is performed as a blanket operation wherein an array or sector of cells can be simultaneously erased and typically produces a lower threshold voltage in the cell.

By way of further detail, a single bit of a flash memory cell may be programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto the nitride layer of the ONO flash. As a result of the trapped electrons, the threshold voltage of the cell increases. This change in the threshold voltage (and thereby the channel conductance) of the cell created by the trapped electrons is what causes the cell to be programmed.

As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer (or die).

For example, another type of flash memory is dual element nitride storage flash memory, which allows multiple bits to be stored in a single cell. In this technology, a memory cell is essentially split into two identical (mirrored) or complementary regions, each of which is formulated for storing one of two independent bits or elements. Each dual element nitride storage flash memory cell, like a traditional cell, has a gate, a source, and a drain. However, unlike a traditional stacked gate cell in which the source is always connected to an electrical source and the drain is always connected to an electrical drain, respective dual element nitride storage flash memory cells can have the connections of the source and drain reversed during operation to permit the storing of two bits or elements.

In virtual ground type architectures, dual element nitride storage flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits or elements per cell by applying a signal to the wordline, which acts as a control gate, and changing bitline connections such that one element is stored by the source and drain being connected in one arrangement and a complementary element is stored by the source and drain being connected in another arrangement.

The closeness of such dual element nitride storage flash architectures, however, also causes certain undesirable phenomena to become prevalent. For example, isolating two elements or charges stored within a charge trapping layer becomes increasingly difficult as the channel length is decreased and the bits or elements are brought closer together. In this manner, the charge on the elements can contaminate or disturb one another, causing operations performed on the elements to be more challenging and introducing a greater opportunity for error. This interdependency or the affect that bits or elements can have on one another is sometimes referred to as complementary bit disturb or CBD.

Regardless of the flash architecture employed, reliably and accurately programming dual element nitride storage flash and multi-level flash cells can be particularly sensitive with the attendant complications of maintaining narrow Vt distributions in order to accurately read and determine a data state from a corresponding Vt level. In addition, after extended cycling and aging, such high density cells may exhibit significant charge loss, which eventually results in reduced data retention reliability. Accordingly, even if the narrow distributions are attained for the multiple levels, unless the memory cells can be programmed to within acceptable limits quickly and efficiently while reliably maintaining data, little competitive advantage may be gained.

In view of the foregoing, a continued need exists for an improved method of quickly and accurately programming or erasing a wordline of multi-level flash memory cells while reducing charge loss in a manner that improves data reliability and achieves narrow Vt distributions of the programmed states.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention accurately programs or erases a wordline of memory cells by applying an interactive singular program verify (SPV) algorithm that measures the threshold voltage Vt of each cell and determines the average threshold voltage Vt(avg) uniquely associated with a single selected wordline, and then uses this characterization of the wordline to customize the program or erase operation, which then reduces charge loss, improves data reliability, and achieves highly compact Vt distributions. The SPV method and system of the present invention is particularly suited for memory cells comprising multi-level flash memory bits (MLB) or elements, for example, having three or more data levels or data states corresponding to three or more threshold voltages.

In one embodiment, a method of programming or erasing one or more memory cells on a wordline of a memory array comprises providing one or more unprogrammed memory cells on a selected wordline to be programmed or erased, and programming one or more of the memory cells of the selected wordline to a predefined program level uniquely associated with a predetermined average threshold voltage Vt(avg) uniquely associated with the selected wordline, or erasing one or more of the memory cells of the selected wordline to the predetermined average threshold voltage Vt(avg).

In another embodiment, the method further comprises initially measuring a threshold voltage (Vt) uniquely associated with the selected wordline for each of the one or more memory cells on the selected wordline, and determining the average threshold voltage Vt(avg) uniquely associated with the selected wordline based on the measured threshold voltages.

In one aspect of the present invention, the one or more memory cells comprise multi-level flash memory cells, comprising element-pairs individually having two or more program levels and a blank level, the levels comprising three or more data levels corresponding to three or more threshold voltages.

In another aspect, the one or more memory cells comprise multi-level memory cells having two or more of the predefined program levels.

In one embodiment, each wordline of a memory array comprises two or more memory cell element-pairs (e.g., dual element nitride storage flash cells having two physical bits or complementary bits per cell), the memory cell element-pairs of the wordline.

In another aspect of the present invention, a method of programming or erasing one or more memory cells on a wordline of a memory array, comprises providing one or more unprogrammed memory cells on a selected wordline to be programmed or erased, measuring a threshold voltage (Vt) uniquely associated with the selected wordline for each of the one or more memory cells on the selected wordline, determining an average threshold voltage Vt(avg) uniquely associated with the selected wordline based on the measured threshold voltages, determining a program verify level uniquely associated with the selected wordline and the determined average threshold voltage Vt(avg), and programming one or more of the memory cells of the selected wordline to a predefined program level uniquely associated with the determined program verify level uniquely associated with the selected wordline, or erasing one or more of the memory cells of the selected wordline to the determined program verify level.

In another aspect of the invention, the predefined program verify (PV) level comprises one of a program verify voltage and a program verify current, and wherein the determined program verify level comprises one of an average program verify voltage and an average program verify current.

In one aspect, the predefined program level comprises one of a plurality of program levels and respective threshold voltages having a respective offset from the determined average threshold voltage. Thus, each of the program levels (e.g., L2, L3, L4) on the wordline of the memory array may be determined as an offset from the average threshold voltage.

The average threshold voltage unique to a singular wordline, essentially provides a wordline specific program characterization of the Vt required for all of the bits, elements, or cells unique to the selected wordline.

In one embodiment, the three or more data levels or data states include a blank level (e.g., L1) or erased state and two or more program levels (e.g., L2, L3, L4). In addition, the method of the present invention is applicable to cells having one or more physical elements per cell, for example, two elements per memory cell or one element-pair per memory cell. The possible (e.g., three or more) data levels of the two elements of each element-pair, for example, provide a number of unique bit pattern combinations which are termed "program patterns" herein. Of these program patterns, another program pattern subset may represent those patterns which are associated with programming the elements of the element-pairs to a program level which is above the blank level or erased state. For example, in a dual-element nitride storage flash cell having four levels per cell, there are 16 possible states or combinations of element-pair patterns (e.g., 11, 12, 21, 13, 31, 14, 41, 22, 23, 32, 24, 42, 33, 34, 43, 44).

The multi-level bit MLB flash memory cell of the present invention may comprise a single physical element of the cell that can be programmed to three or more levels corresponding to three or more data states. Alternately, the MLB cell may comprise a dual element nitride storage flash or mirror-bit cell having two physically distinct elements that may each be programmed to multiple levels such as four, wherein 16 possible states are then available. The method may be suitably implemented in a variety of non-volatile and flash memory architectures including single and dual element nitride storage flash EEPROM, and other such single or multi-bit memory architectures that may be electrically programmed, and any such cell or element variant is contemplated as falling within the scope of the present invention.

The present invention provides an improved method of quickly and accurately programming or erasing a wordline of multi-level flash memory cells while reducing charge loss in a manner that improves data reliability and achieves narrow Vt distributions of the programmed states.

In another aspect of the present invention, a memory device, comprises a memory array, a threshold voltage measuring component configured to measure a threshold voltage (Vt) uniquely associated with a selected wordline for one or more memory cells on the selected wordline, and an average threshold voltage determining component configured to determine an average threshold voltage Vt(avg) uniquely associated with the selected wordline based on the measured threshold voltages on the selected wordline of the memory array, wherein the memory device is configured to program or erase one or more memory cells on a selected wordline of the memory array.

In yet another aspect, the memory array comprises a multi-bit flash memory, and wherein the memory device is configured to program one or more of the memory cells of the selected wordline to a predefined program level uniquely associated with the determined average threshold voltage Vt(avg) uniquely associated with the selected wordline, or erase one or more of the memory cells of the selected wordline to the determined average threshold voltage Vt(avg).

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 2B is a chart of possible program pattern combinations for a dual element nitride storage flash memory cell such as a QuadBit flash memory cell, wherein each of the elements can be stored at four (4) different data levels and wherein a program element is programmed to a non-blank level (program level) in accordance the method of the present invention.

FIGS. 3B-3D are distribution plots of a group of memory cells, and a corresponding program verify level such as may be determined from the distribution in a prior art method.

DETAILED DESCRIPTION OF THE INVENTION

Figure 1A:
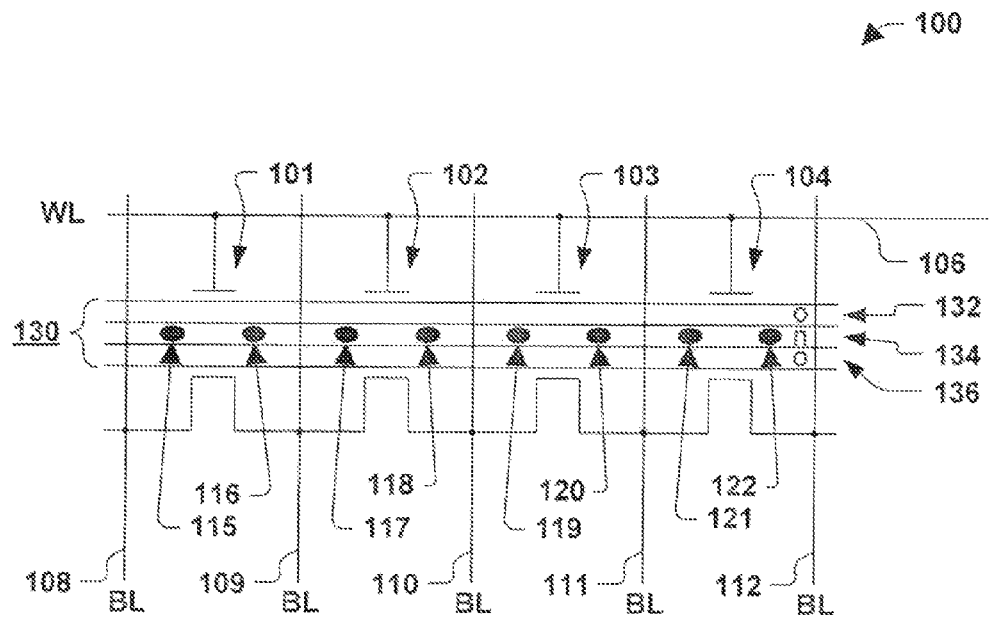
FIG. 1A is a schematic illustration of a portion of a wordline of dual element nitride storage flash memory cells.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Improvements in the density of memory devices translate to increased memory capacity. Density and thus capacity is a major consideration in the cost of fabrication and the marketability of memory devices, and is directly related to the amount of real estate used to store a bit of information on a semiconductor chip. Density may be increased, for example, by scaling down feature size to accommodate more memory cell transistors on a given size chip thereby achieving higher density. Another technique to increase density and reduce manufacturing costs is thru the use of multi-level cell technology.

Multi-level cells increase cell density by increasing the number of possible logical states or data states associated with a cell, thereby allowing a single memory cell to store information corresponding to more than one data bit. One way this has been done is by using multiple (three or more, in the context of cell levels and states) threshold voltage (Vt) levels, which correspond to multiple data states per cell. This contrasts to the two states and levels used in conventional flash memory cells. Thus, in one example, a single dual-element nitride storage flash cell may have two physical bits or elements of data each at four or more Vt levels corresponding to four or more logical states. Cells, having multiple levels, however, present many new problems attempting to maintain well controlled or tight distributions of the Vt levels, particularly as larger data bit quantities are considered. In addition, with extended cycling, cycling to high Vt levels, aging, and exposure to higher temperatures, such high density cells may exhibit significant charge loss, which may result in reduced data retention reliability and eventually in data loss.

As a result of these trends, accurate programming, erasure, and the determination of the levels of such multi-level cells becomes increasingly demanding, particularly as higher bit capacities are expected of memory cells. Accordingly, multi-level memory cells as well as other types and architectures of high density memory cells need to be programmed or erased quickly and efficiently to save program operations time, to avoid charge loss, and improve data reliability. In addition, the cells need to be programmed to a well controlled narrow program Vt distribution (tight bit compacting). Such device requirements and issues are likely to increase as device features continue to shrink and the density of memory cells increases.

Accordingly, it is a goal of the present invention to provide a method of programming and erasing a wordline of an array of suitable memory cells, which achieves the aforementioned requirements while also providing improved Vt program distributions, data reliability, as well as reduced charge loss.

An SPV program algorithm method and system may be used in accordance with the present invention to program or erase cells along a single selected wordline of a memory, based on a determined average threshold voltage uniquely associated with the selected wordline.

The algorithm achieves well controlled compact Vt program level distributions with increased windows between these distributions compared to those of some conventional methods. The method may be suitably implemented in a variety of flash memory architectures including single and dual element nitride storage flash EEPROM, and other such single and multi-bit memory architectures that may be electrically programmed, and any such cell or variant is contemplated as falling within the scope of the present invention.

Referring initially to FIG. 1A, a schematic illustration is presented of a portion of a wordline of dual element nitride storage flash core memory cells 100 such as may be included in at least part of an array of multi-level flash memory cells. The circuit schematic shows a group of memory cells 101 through 104 in a virtual ground type implementation, for example. The respective memory cells 101 through 104 are connected to a wordline 106, which serves as a control gate, and pairs of the memory cells share a common bitline. For instance, in the example shown, the memory cell 101 has associated bitlines 108 and 109; the memory cell 102 has associated bitlines 109 and 110; the memory cell 103 has associated bitlines 110 and 111; and the memory cell 104 has associated bitlines 111 and 112. As such, cells 101 and 102 share bitline 109, cells 102 and 103 share bitline 110 and cells 103 and 104 share bitline 111, respectively.

Depending upon wordline voltages and bitline connections, the memory cells 101 through 104 are capable of writing, reading, and erasing elements at locations 115 through 122. In addition to voltages applied to the wordline 106, reading the element (e.g., "A" bit of cell 101) at location 115, for example, is achieved through connection of the drain to the bitline 109 and the source to the bitline 108. Similarly, reading the element (e.g., "B" bit of cell 101) at location 116 is achieved through connection of the drain to the bitline 108 and the source to the bitline 109. Storage of multiple elements is made possible, at least in part, by a charge trapping dielectric layer 130 interposed between the bitlines and the wordline. The charge trapping dielectric layer 130 includes multiple insulating layers 132, 136 (e.g., of oxide based material) that sandwich a charge trapping layer 134 (e.g., of nitride based material). Given its layer to layer composition, the charge trapping dielectric layer 130 is often referred to as an ONO layer (for the oxide, nitride, oxide layers).

The ONO layer 130 allows the different elements to be stored at multiple states or levels as well. For example, depending upon the voltage applied to the memory cells 101 through 104 by the control gate or wordline 106 during programming, varying amounts of charge can be stored at locations 115 through 122. The different amounts of charge may correspond to different bit or element states or levels, for example. If four different charge levels or data levels (e.g., 1, 2, 3 and 4) can be stored at each of the element locations 115 through 122, for example, then each two-element cell 101 through 104 can have 16 different combinations of stored data (e.g., 1-1, 1-2, 1-3, 1-4, 2-1, 2-2, 2-3, 2-4, 3-1, 3-2, 3-3, 3-4, 4-1, 4-2, 4-3 and 4-4) which may also be represented as (e.g., 11, 12, 13, 14, 21, 22, 23, 24, 31, 32, 33, 34, 41, 42, 43 and 44), respectively.

Figure 1B:
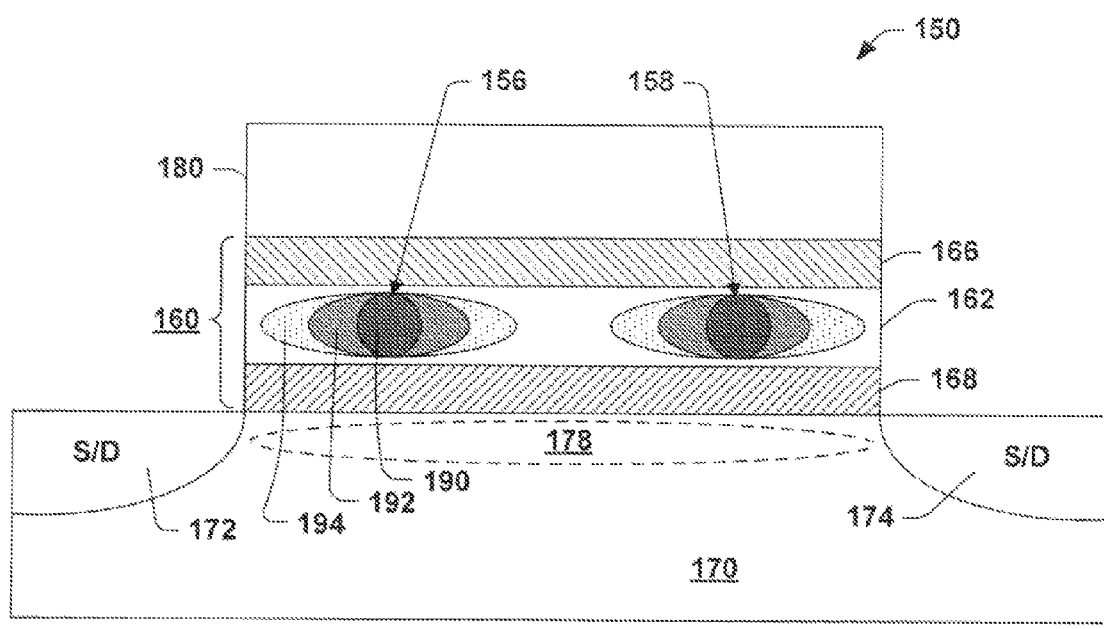
FIG. 1B is a cross-sectional view of a dual element nitride storage flash memory cell wherein each of the elements can be stored at multiple levels.

FIG. 1B is a cross sectional view of a dual element nitride storage flash memory cell 150 illustrating the capability of the cell to store varying degrees of charge at element locations 156 and 158. It will be appreciated that the memory cell 150 may, for example, correspond to the memory cells 101 through 104 depicted in FIG. 1A. The cell 150 includes a charge trapping dielectric layer (ONO layer) 160 that comprises a charge trapping layer 162 sandwiched between two dielectric layers 166, 168. The charge trapping layer 162 is formed from one or more substantially non-conductive substances, such as nitride based materials. The dielectric layers 166, 168 are similarly formed from one or more electrically insulating substances, such as oxide based materials.

The charge trapping ONO layer 160 is formed over a substrate 170 that may be formed from silicon or some other semiconductor material, for example. The substrate 170 may be selectively doped with a p-type dopant, such as boron, for example, to alter its electrical properties. In the example illustrated, the substrate 170 has buried bitlines or bitline diffusions including a first bitline diffusion 172 and a second bitline diffusion 174. The bitline diffusions 172 and 174 may, for example, be formed by an implanted n-type dopant, and may correspond to bitlines 108 through 112 in FIG. 1A. A channel 178 is defined within the substrate between the first 172 and second 174 bitline diffusions (e.g., S/D extensions, deep S/D regions).

Overlying the upper dielectric layer 166 of the ONO layer 160 is a gate 180. This gate 180 may be formed from a polysilicon material, for example, and may be doped with an n-type impurity (e.g., phosphorus) to alter its electrical behavior. The gate 180 may, for example, correspond to the wordlines 106 in FIG. 1A. The gate 180 enables a voltage to be applied to the cell 150 such that respective charges can, among other things, be stored within the cell at locations 156, 158, depending upon the electrical connections of the bitline diffusions 172, 174.

The dual element nitride storage flash memory cell 150 is generally symmetrical, thus the bitline diffusions 172 and 174 are interchangeable as acting source and drain. Thus, the first bitline diffusion 172 may serve as the source and the second bitline diffusion 174 as the drain with respect to right element location 158 for programming. Likewise, the second bitline diffusion 174 may serve as the source and the first bitline diffusion 172 as the drain for the left element location 156 for programming. The cell 150 can be programmed by applying a voltage across the gate 180 and an acting drain region, and connecting an acting source region to ground, for example.

When programming the cell 150, the acting drain region is typically biased to a potential above the acting source. As a result of the gate bias, a high electric field is applied across the charge trapping layer 162. Due to a phenomenon known as "hot electron injection", electrons pass from the acting source region through the lower dielectric layer 168 and become trapped in the charge trapping layer 162 at locations 156 or 158, also known as left element location 156 and right element location 158. It will be appreciated that a second element can be programmed to the alternate location 158 or 156 by reversing the acting source and drain and again applying a bias to the control gate 180.

By way of example, the left element location 156 can be programmed by applying a program voltage to the gate 180 and a drain voltage to the second bitline 172, which is an acting drain for the left location 156. The first bitline 174, which is an acting source for programming the left element location 156, can be connected to ground, or biased to a different voltage level. The applied voltages generate a vertical electric field through the dielectric layers 168 and 166 and also through the charge trapping layer 162, and generate a lateral electric field across a length of the channel 178 from the first bitline diffusion 172 to the second bitline diffusion 174. At a given voltage, the channel 178 inverts such that electrons are drawn off the acting source (the first bitline diffusion 174 in this example) and begin accelerating towards the acting drain (the second bitline diffusion 172 in this example).

As the electrons move along the length of the channel 178, the electrons gain energy and, upon attaining enough energy, the electrons jump over the potential barrier of the bottom dielectric layer 168 and into the charge trapping layer 162, where the electrons become trapped. The probability of electrons jumping the potential barrier in this arrangement is a maximum in the area of the left element location 156, adjacent the first bitline diffusion 172, where the electrons have gained the most energy. These accelerated electrons are termed hot electrons and, once injected into the charge trapping layer 162, stay in about the general area indicated for the left element. The trapped electrons tend to remain generally localized due to the low conductivity of the charge trapping layer 162 and the low lateral electric field therein. Programming the right element location 158 is similar, but the first bitline 174 operates as an acting drain and the second 172 operates as an acting source.

For a read operation, a certain voltage bias is applied across an acting drain to an acting source of the cell 150. The acting drain of the cell is a bitline, which may be connected to the drains of other cells in a byte or word group. A voltage is then applied to the gate 180 (e.g., the wordline) of the memory cell 150 in order to cause a current to flow from the acting drain to the acting source. The resulting current is measured, by which a determination is made as to the value of the data stored in the cell. For example, if the current is above a certain threshold, the element is deemed unprogrammed or a logical one, whereas if the current is below a certain threshold, the element is deemed to be programmed or a logical zero. A second element can be read by reversing operations of the first and second bitline diffusions 172 and 174 for the acting drain and the acting source.

It can be appreciated that if the voltages utilized to program the left 156 and right 158 element locations of the cell 150 are increased or sustained for longer periods of time, the number of electrons or amount of charge stored at these locations can be increased or otherwise varied. This allows the cell 150 to be utilized for additional data storage. For example, different amounts of charge can correspond to different programmed states. In the example illustrated, for instance, both the left 156 and right 158 element locations can be said to have four different states or levels, namely 1, 2, 3 and 4, where level 1 (L1) corresponds to a situation where the locations are blank or un-programmed, and levels 2, 3 and 4 (L2, L3, and L4, respectively) correspond to programmed levels or increased amounts of stored charge, respectively. With regard to the left element location 156, for example, a level 2 may correspond to a relatively small amount of stored charge 190, while levels 3 and 4 may correspond to increasingly larger amounts of stored charge 192 and 194, respectively. As indicated previously, this technique is also called multi-level cell technology, which is useful to increase density and reduce manufacturing costs.

Multi-level cells increase the effective cell density by increasing the number of possible logical states or data states associated with a cell, thereby allowing a single memory cell to store information corresponding to more than one data bit or element. One way this has been done is by using multiple (three or more, in the context of cell levels and states) threshold voltage (Vt) levels, which correspond to multiple data states per cell. This contrasts to the two states or levels used in conventional flash memory cells. Thus, in the example above, a single dual element nitride storage flash cell may store in each of its two physical bits or elements, four Vt levels corresponding to four logical states.

Figure 2A:
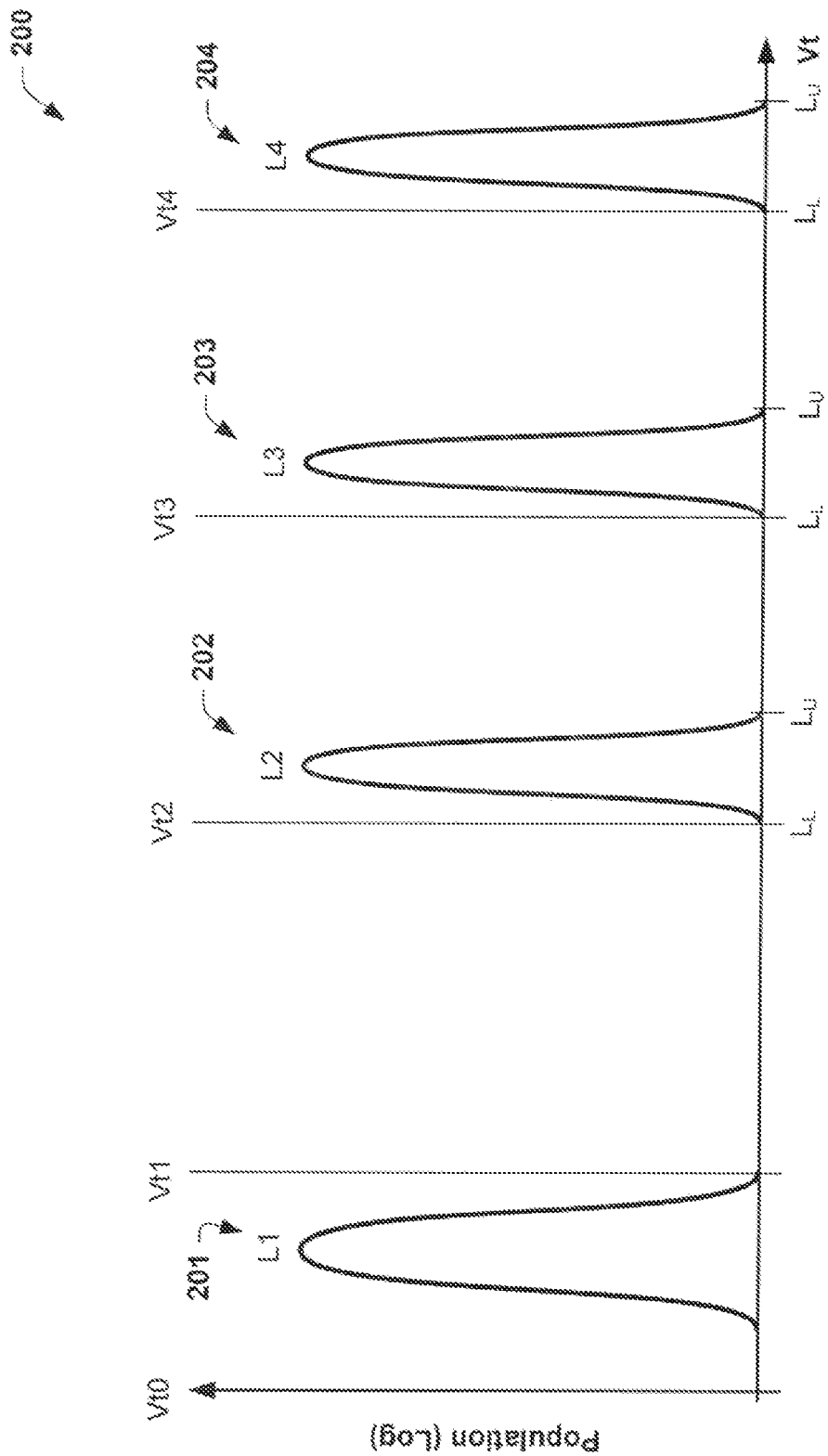
FIG. 2A is a Vt distribution of a four level multi-level cell in accordance with an aspect of the present invention and such as may apply to the dual element nitride storage flash cell of FIG. 1B, and the programming and erasing thereof utilizing the method of the present invention.

For example, FIG. 2A illustrates an unsigned Vt distribution 200 of a four level MLB cell in accordance with an aspect of the present invention is illustrated. Vt distribution 200 represents four discrete populations of memory bit threshold voltages. Each threshold voltage population occupies a range of Vt values separated into four discrete designated levels L1, L2, L3, and L4. Each level (e.g., L1, L2, L3, and L4) of the respective Vt population further has a corresponding target threshold voltage, for example, Vt1, Vt2, Vt3, and Vt4, respectively. For purposes of simpler program and read verification, the target threshold voltage for the corresponding level may be located at one of the upper Vt limits ($L_U$) or lower Vt limits ($L_L$) of the respective level as shown. For example, if L1 is chosen as the erased state of a four-level device, a voltage read detected below Vt1 indicates an erased or unprogrammed state, while a Vt voltage detected greater than Vt2 but less than Vt3 indicates an L2 level, a Vt voltage detected greater than Vt3 but less than Vt4 indicates an L3 level, and a Vt voltage detected greater than Vt4 indicates an L4 level.

The various levels of FIG. 2A, however, may be arbitrarily assigned corresponding binary states (e.g., L1=11, L2=10, L3=01, and L4=00, or L1=00, L2=01, L3=10, and L4=11) as desired by the user. The four-level MLB cell associated with the distribution 200 may comprise a single physical bit or element that can be programmed to two levels or more (plus a blank level), or alternatively, may comprise a dual element nitride storage flash cell having two physically distinct elements that may each have multiple levels such as four, wherein 16 or more possible combinations of states between two elements.

The method of the present invention is suitably implemented in MLB memory devices having any number of levels and combination of both positive and negative Vt distributions. In FIG. 2A, for example, the method of the present invention is equally applicable whether Vt0 or Vt1, Vt4, or another such Vt limit is used as a zero voltage potential or another reference potential of the memory cells. Although the example would seem to imply that the L1 level corresponds to the erased condition, the L1, L4, or any other level may represent the erased state. Further, target threshold voltages Vt2, Vt3, and Vt4 may, for example, have values such as Vt2=1.5V, Vt3=2.1V, and Vt4=2.7V from Vt1.

Considering the four levels of FIG. 2A as applied to the dual element nitride storage flash memory elements examples of FIGS. 1A and 1B, the method of the present invention may be used to program unprogrammed memory cells initially erased to L1 data states to a target threshold voltage of Vt2, Vt3, or V4, as desired, corresponding to the L2, L3, and L4 data states in a programming operation, or to erase the memory cells of the selected wordline. As shown in FIG. 2A, during programming operations, pulses may be applied to one or more memory cell element-pairs along a wordline to program the cells to a selected "program pattern", such as 21 (L2 for the left element, and L1 for the right element) or any other combination of words or program patterns. Pulses are applied in successive programming pulses applied to the memory cells. The elements of the complementary element-pairs are programmed in this way, until the Vt of each element of the element-pair achieves the respective final target threshold voltage corresponding to the respective program level, usually as determined by a program verify level established for each program level.

Thus, an objective of the method of the present invention is to program the memory cells of the array in a fast and efficient manner based upon determining an average threshold voltage uniquely associated with a single wordline.

Another objective of the method of the present invention is to narrow, or "compact" the population boundary levels $L_U$ and $L_L$ of the same (e.g., L2) distribution closer to one another, as is also illustrated in FIG. 2A. Sigma is often used to symbolize the standard deviation of such a population, which is a measure of the variability of the population. Accordingly, a smaller sigma indicates a narrower Gaussian distribution of the population, indicating that more threshold voltages are populated closer to the target Vt(target), which further results in improved or wider "windows" between these distributions, for example, between boundary level $L_U$ of one distribution and boundary level $L_L$ of the next higher distribution (e.g., between $L_U$ of L2 and $L_L$ of L3, or between $L_U$ of L3 and $L_L$ of L4).

The contributors to the present invention have realized that to get a predictable and well-controlled programmed Vt distribution from MLB memory cells and to minimize charge loss, one solution is to first measure the Vt distribution of the cells and determine an average Vt uniquely associated with a particular wordline, and then to program or erase the cells to a program level (e.g., L2, L3, and L4) that is relative to that determined average Vt or Vt(avg), for example. As a result, this method may be faster and improve data reliability more than some other conventional program/erase methods.

FIG. 2B illustrates a chart 220 of possible program pattern combinations for a dual element nitride storage flash memory cell such as a QuadBit flash memory cell 150 of FIG. 1B in accordance the method of the present invention. For example, each of the elements of the element-pair can be stored at four (4) different data levels L1, L2, L3, and L4, and wherein a program element is programmed to a non-blank level (program level L2, L3, and L4).

Chart 220 further illustrates a left element (e.g., element 156 of cell 150 of FIG. 1B) in column 224, and a right element (e.g., element 158 of cell 150 of FIG. 1B) in column 226 of FIG. 2B. Column 222 indicates the left element status (e.g., a blank or program level), while column 228 indicates the right element status (e.g., a blank or program level). Column 230 illustrates the bit pattern represented by the respective element-pair when the left element is read from the cell, while column 232 illustrates the bit pattern represented by the respective element-pair when the right element is read from the cell.

Figure 3A:
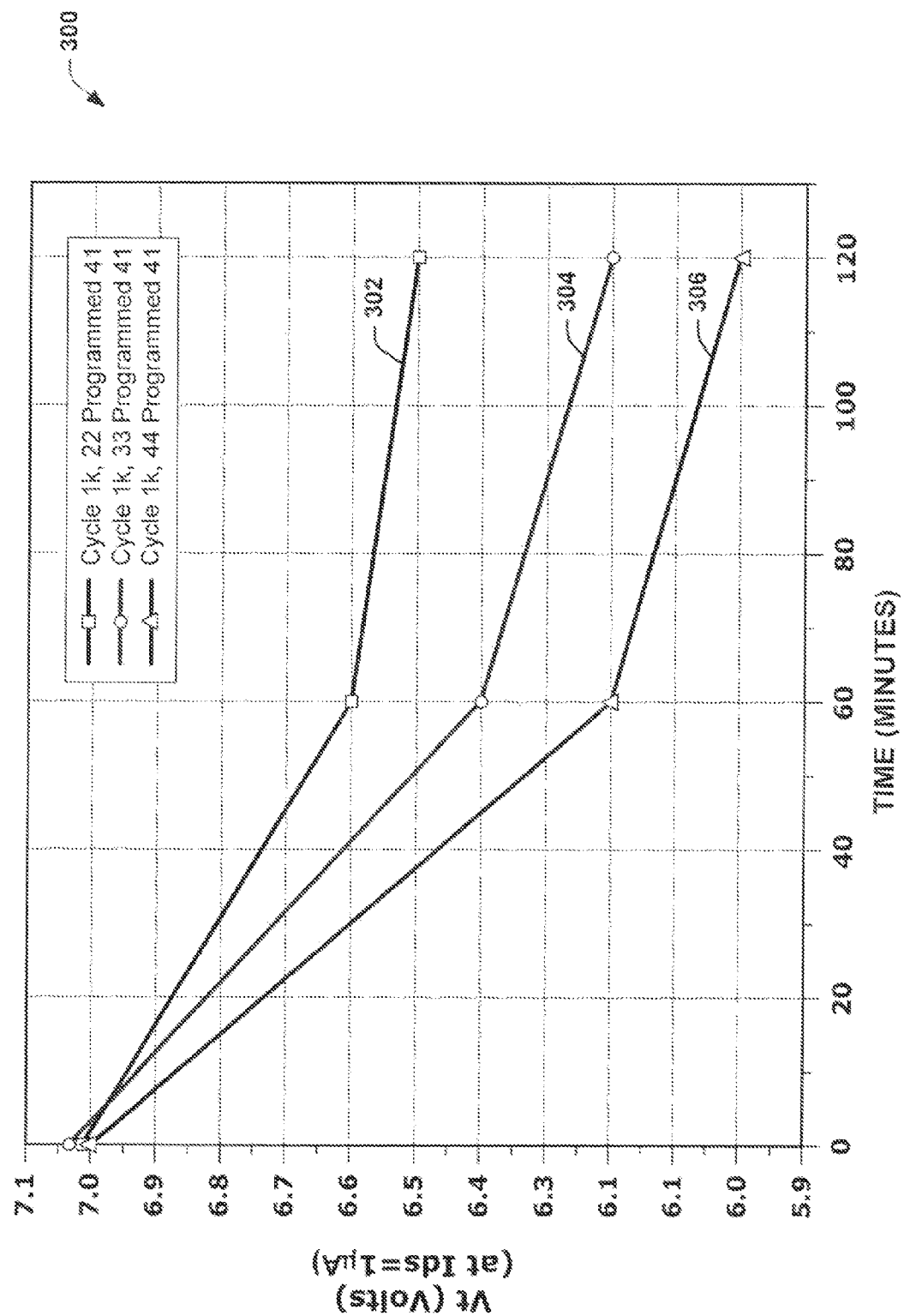
FIG. 3A is a plot of the effects of charge loss in three groups of dual-element memory cells after 1000 program-erase cycles to three respective program levels and in response to accelerated thermal aging.

FIG. 3A illustrates a plot 300 of the effects of charge loss in three groups of dual-element memory cells after 1,000 program-erase cycles, of programming to three respective program levels and in response to accelerated thermal aging. In particular, cell group 302 was successively programmed to a program pattern of 22, or ΔVt=22, and then erased to a program pattern of 11 for 1,000 times. Similarly, cell group 304 was successively cycled between a ΔVt=33 and ΔVt=11 for 1,000 times, cell group 306 was successively cycled between a ΔVt=44 and ΔVt=11 for 1,000 times. Upon completion of this cycling, each cell of the three cell groups was then programmed to a program pattern of 41 and subjected to a 200° C. bake which generally simulates a form of accelerated aging or stress on the memory cells. The charge loss from the 41 level was then monitored for 2 hours as shown along the X-axis (Time (Minutes)).

From plot 300, the three cell groups initially measure about 7.0 volts at time=0, but then start indicating an increasing charge loss over the 2 hour bake. It can be clearly seen from plot 300 that the magnitude of charge loss varies significantly between the three cell groups. In particular, the charge loss appears to be generally proportionate to the cycle stress level to which the cell groups were initially exposed. For example, cell group 306, which was cycled to the highest level (ΔVt=44) exhibits 500 mV more charge loss over the 2 hour bake (e.g., dropping from 7.0V to about 6.0V) than cell group 302, which was cycled to the lowest level of cycling (ΔVt=22) (e.g., dropping from about 7.0V to about 6.5 V). The contributors to the present invention have also appreciated that the results of FIG. 3A illustrates that the various cells of a sector may over time and cycling stresses, become significantly different in their response to programming and erase operations, and thus may not be able to be programmed and erased reliably using the same conditions (e.g., program levels, program verify levels).

FIGS. 3B-3C illustrates a distribution plot 320 for a group of memory cells, and a corresponding program verify level (PV) 366 such as may be determined from the distribution 320, for example, in a prior art method.

The Vt distribution 320 of FIG. 3B illustrates an initial distribution of Vt values for a group of memory cells, for example, arranged along a wordline of an array. It is presumed that the group of cells has a common target Vt level, such as an erase, blank, or unprogrammed Vt level (L1-201), or a common program Vt level, such as level L2-202,L3-203 or L4-204, as shown in FIG. 2A and discussed in connection with FIG. 2B. As illustrated in FIG. 3B, the Vt distribution 320 may range from a minimum Vt value Vt(min) 322 of, for example, 2.75 volts to a maximum Vt value Vt(max) 324 of about 3.67 volts, or as illustrated in FIG. 3C, the Vt distribution 320 may also be represented as ranging from a corresponding minimum register (REG) value 342 of 45 to a corresponding maximum register value 344 of 39, for example. Thus, for each threshold voltage value Vt there can be a corresponding register value which may be more easily used by the memory device.

In FIG. 3D, a program verify level PV 366 may then be determined from the distribution 320, for example, from the maximum register value 344 of 39 of FIG. 3C, by subtracting a predetermined offset such as 14 from the maximum register value of 39, for example, according to:

PV=Max register value−14

PV=39−14=25

Thus, from FIG. 3D, the program verify level PV 366 may be determined to be 25. Those skilled in the art will appreciate that the program verify level PV 366 may be useful in programming memory cells to a predetermined program level, for example, by applying programming pulses to the selected cells until the predetermined (e.g., calculated) program verify level PV 366 is achieved.

Figure 4A:
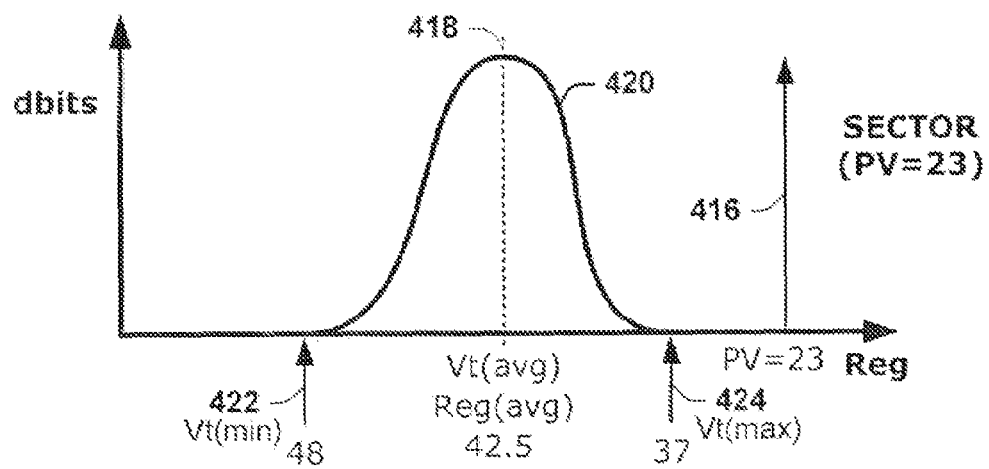
FIGS. 4A-4C are distribution plots of several exemplary groupings of memory cells, and a corresponding program verify level, such as may be determined from the distribution, contrasting a prior art method in FIG. 4A to an exemplary method of the present invention in FIGS. 4B and 4C.
Figure 4B:
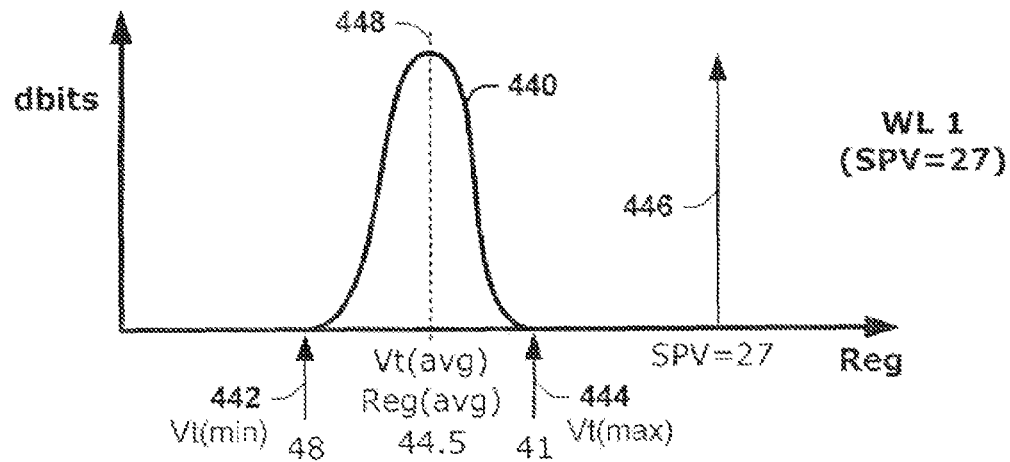
Figure 4C:
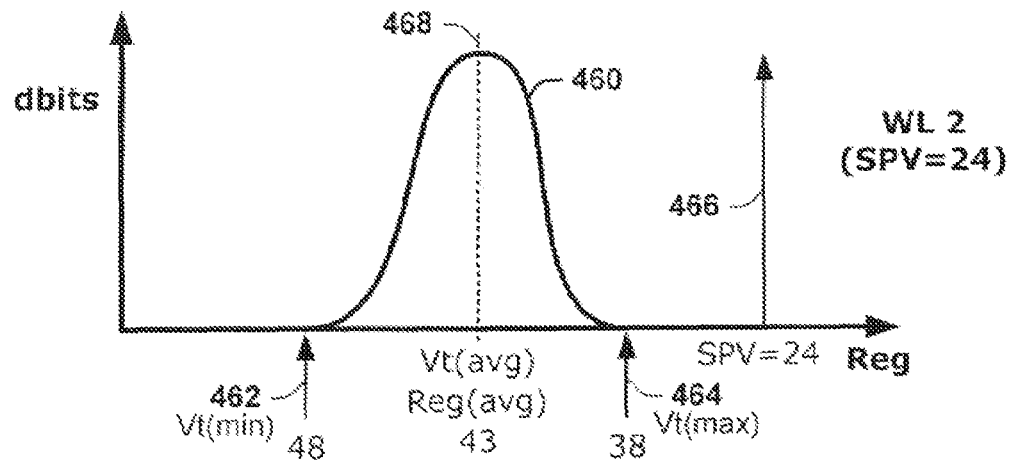

FIGS. 4A-4C illustrate three distribution plots of exemplary groupings of memory cells, and a corresponding program verify level, such as may be determined from the respective distribution, for example, contrasting a prior art method in FIG. 4A to an exemplary method of the present invention in FIGS. 4B and 4C.

For example, FIG. 4A, illustrates a distribution plot 420 of an entire sector of memory cells, ranging from a minimum Vt value Vt(min) 422 corresponding to a register value of 48 at 422, to a maximum Vt value Vt(max) 424 corresponding to a register value of 37 at 424. A prior art program verify determining method (e.g., a prior art global program verify (PV) method) then takes this distribution 420 and the maximum Vt value at Vt(max) 424 having a register value of 37, and subtracts the predetermined program verify offset value of 14 to achieve a program verify (PV) value of PV 416=23. This PV value of 23 is then used for all wordlines (WL's) in that entire sector. However, the inventors of the present invention have discovered and appreciated that the Vt values across a sector vary too dramatically to be useful for the accurate program level determinations which are needed as current trends continue, and particularly if greater numbers of program levels are to be utilized in multilevel memory cells.

For example, FIG. 4B illustrates a Vt distribution 440 for wordline WL 1 of the sector of FIG. 4A, and FIG. 4C illustrates a Vt distribution 460 for wordline WL 2 of the sector of FIG. 4A. If a program verify determination is individually made on each of these wordlines, it can be seen that wordline WL 1, which ranges from a register value of 48 at Vt(min) 442 to a register value of 41 at Vt(min) 444, will produce a singular wordline program verify (SPV) value of SPV 446=(41−14)=27, while wordline WL 2 which ranges from a register value of 48 at Vt(min) 452 to a register value of 38 at Vt(min) 464, will produce an SPV value of SPV 466=(38−14)=24.

Because WL 1 has a much narrower distribution and range values than WL 2, the program verify values of the individual wordlines are also much different. If WL 1 was programmed using the PV 416=23, rather than the customized SPV 446=27, WL 1 would be programmed by 4 register settings lower than the SPV actually needed, and if WL 2 was programmed using the PV 416=23, rather than the customized SPV 466=24, WL 1 would be programmed by 1 register setting lower than the SPV actually needed. Thus, it can be seen that different PV or SPV register settings may be uniquely assigned and used according to the variations of each wordline in accordance with the present invention. As a consequence, WL 1 will take longer to program than WL 2 because WL 1 is being programmed to a higher ΔVt. In essence, each wordline will then be programmed up by a different ΔVt if the generic global PV of the sector is used to program verify rather than the wordline characterized SPV.

Accordingly, the inventors of the present invention propose utilizing a wordline by wordline programming and/or program verify determination approach or singular (wordline) program verify (SPV) method, which is uniquely associated with a selected wordline which is to be programmed or erased. The method of the present invention, allows a customization of the SPV program verify values uniquely associated with the selected wordline.

Further, the inventors of the present invention have also appreciated that the singular wordline program verify value may be determined from an average Vt value Vt(avg) or a corresponding register average Reg(avg) of the Vt distribution of the selected wordline. For example, just as an average Vt or Vt(avg) 418 for the sector of FIG. 4A may be determined corresponding to a register average Reg(avg)=42.5, an average Vt or Vt(avg) 448 for WL 1 of FIG. 4B may be determined corresponding to Reg(avg)=44.5, while a Vt(avg) 468 for WL 2 of FIG. 4C may be determined corresponding to Reg(avg)=43. Both the Vt(avg) and the Reg(avg) provide similarly useful data representative of the characteristics of a single wordline which is selected to be programmed or erased.

Figure 5:
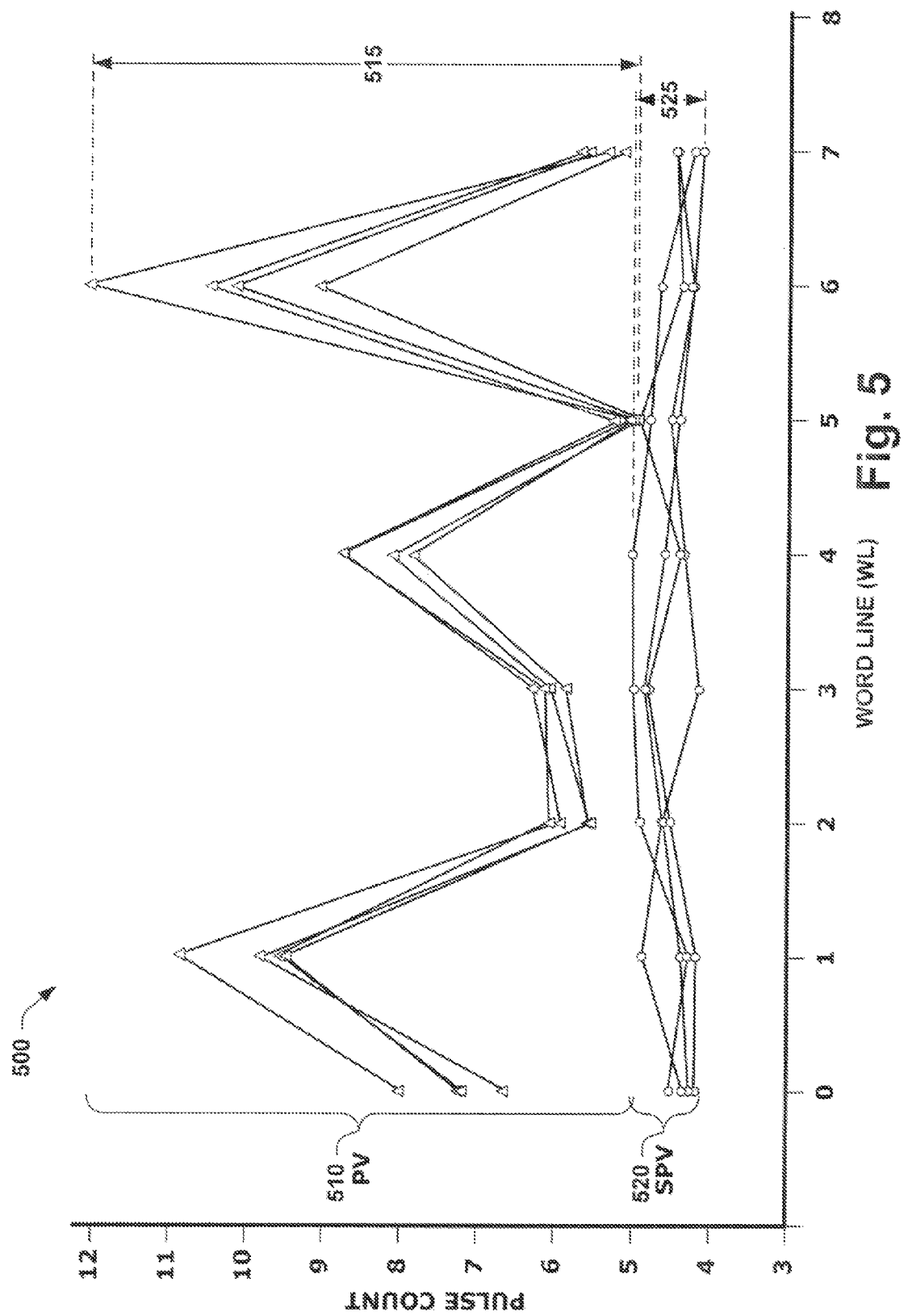
FIG. 5 is a plot comparing the results of the number of program pulses required to program verify several exemplary wordlines of memory cells according to a prior art global program verify (PV) method, and according to an exemplary singular (wordline) program verify (SPV) method of the present invention.

FIG. 5 illustrates a comparison plot 500 of the results of the number of program pulses which are required to program verify several exemplary wordlines of memory cells according to a prior art global program verify (PV) method in plot 510, and according to an exemplary singular (wordline) program verify (SPV) method in plot 520 of the present invention. It will be appreciated by those skilled in the art that the number of programming pulses (pulse count—X axis) required to achieve a predetermined PV or SPV level, generally corresponds to the variation in the average Vt or Vt(avg) of a particular or selected wordline. Thus, the continual variation in Vt from wordline to wordline discussed above will result in the variation in the program pulse count observed in FIG. 5.

Accordingly, it may be observed, comparing the PV prior art method of plot 510 to the SPV method of plot 520, that the variation in the program pulse count required from wordline to wordline in the SPV method of plot 520 is dramatically reduced by the method of the present invention. For example, the PV variation 515 of plot 510 is much greater than the SPV variation 525 observed in plot 520 programmed in accordance with the methods and systems illustrated in the present invention. Thus, it can be seen that this variation can be considerably reduced if a singular program verify SPV is used, calculated for each individual word line.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

Figure 6:
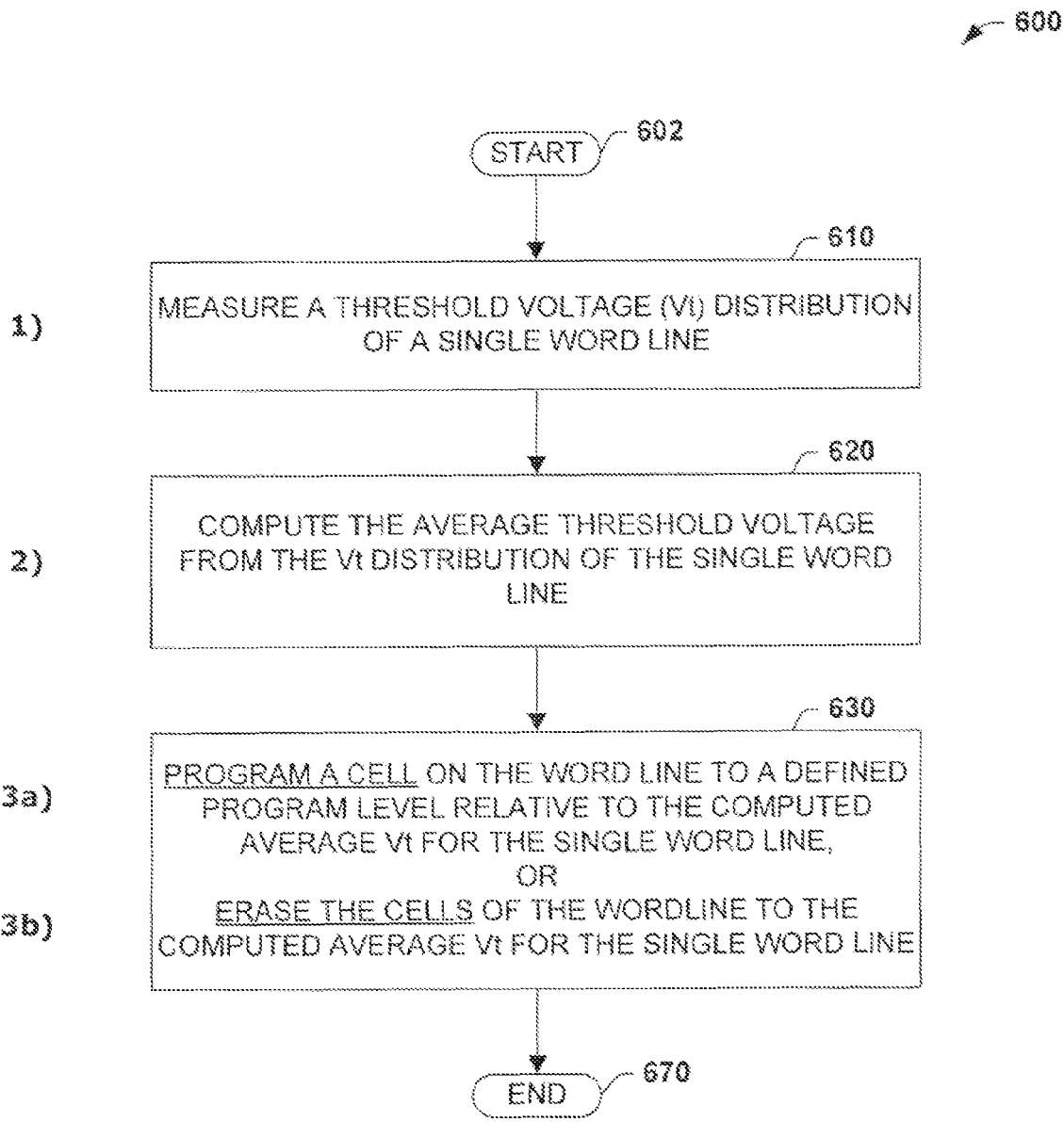
FIG. 6 is flow diagram illustrating an exemplary method of programming or erasing a wordline of memory cells that includes programming one or more memory cells of the selected wordline to a predefined program level uniquely associated with a predetermined average threshold voltage uniquely associated with the selected wordline, or erasing one or more of the memory cells of the selected wordline to the predetermined average threshold voltage in accordance with an aspect of the present invention.

FIG. 6, for example, illustrates an exemplary method 600 of programming or erasing a wordline (e.g., WL 106 of FIG. 1A, or WL 1, WL 2 of FIGS. 4B, 4C) of memory cells (e.g., dual-element cells 101-104 of FIG. 1A, 150 of FIG. 1B) that includes providing one or more memory cells on a selected wordline to be programmed or erased, and programming one or more memory cells of the selected wordline to a predefined program level (e.g., L2, L3, L4), (or a predetermined singular program verify level, SPV 446, SPV 466) that is uniquely associated with a predetermined average threshold voltage Vt(avg) (e.g., Vt(avg) 448, 468) uniquely associated with the selected wordline (e.g., WL 1, WL 2 of FIGS. 4B, 4C, or WL 106 of FIG. 1A), or erasing one or more of the memory cells of the selected wordline to the predetermined average threshold voltage Vt(avg) in accordance with an aspect of the present invention.

While the term "wordline" or "array" is used throughout, it should be understood that such terms are not to be construed as limiting to one specified grouping of cells or bits, but rather may apply to any grouping of MLB cells including single or multi-bit cells.

Figure 7:
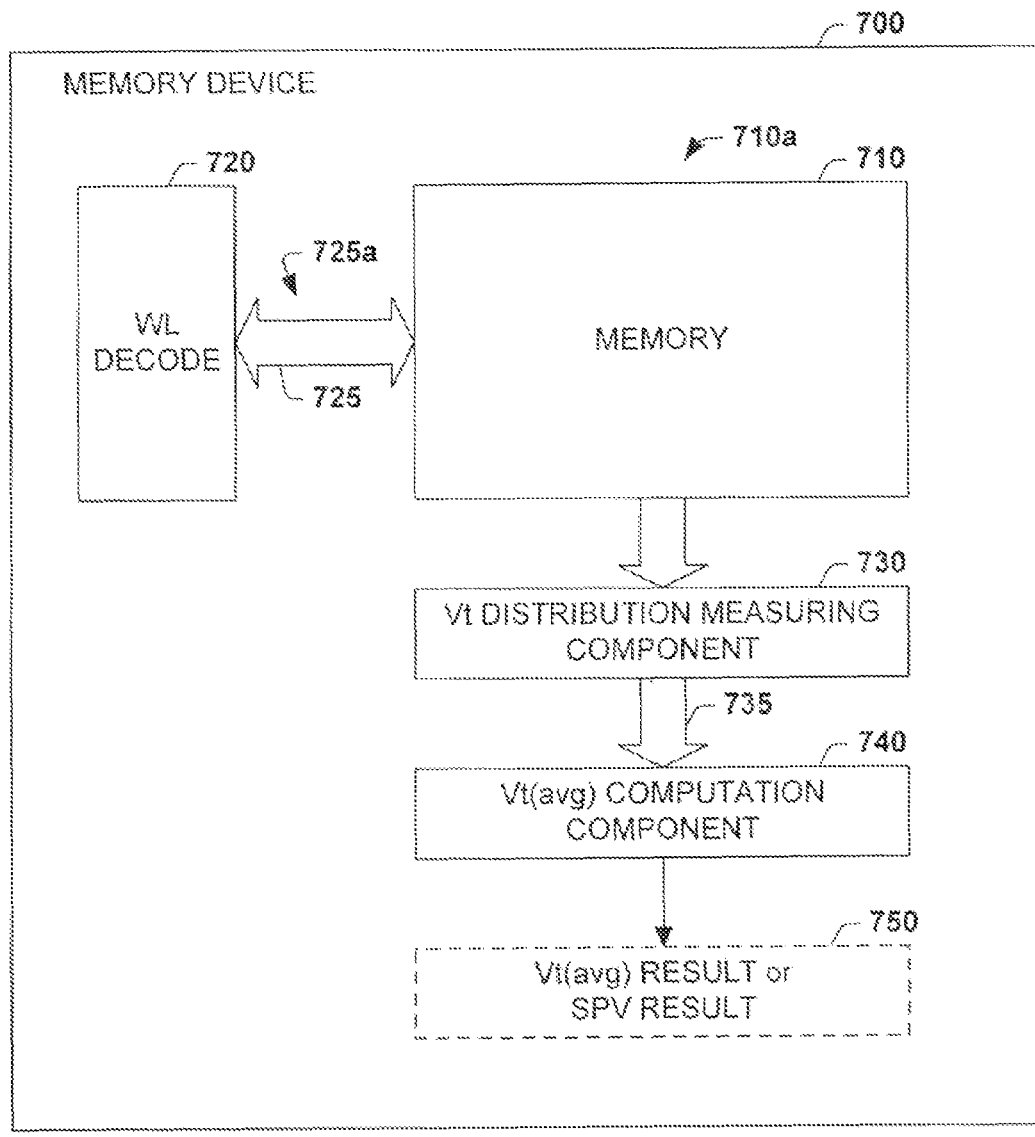
FIG. 7 is an exemplary memory device comprising a threshold voltage distribution measuring component and an average threshold voltage determining component, the memory device configured to program or erase one or more memory cells on a wordline of a memory array based on an average threshold voltage uniquely associated with the selected wordline, in accordance with the singular program verify (SPV) method of FIG. 6.
Figure 8:
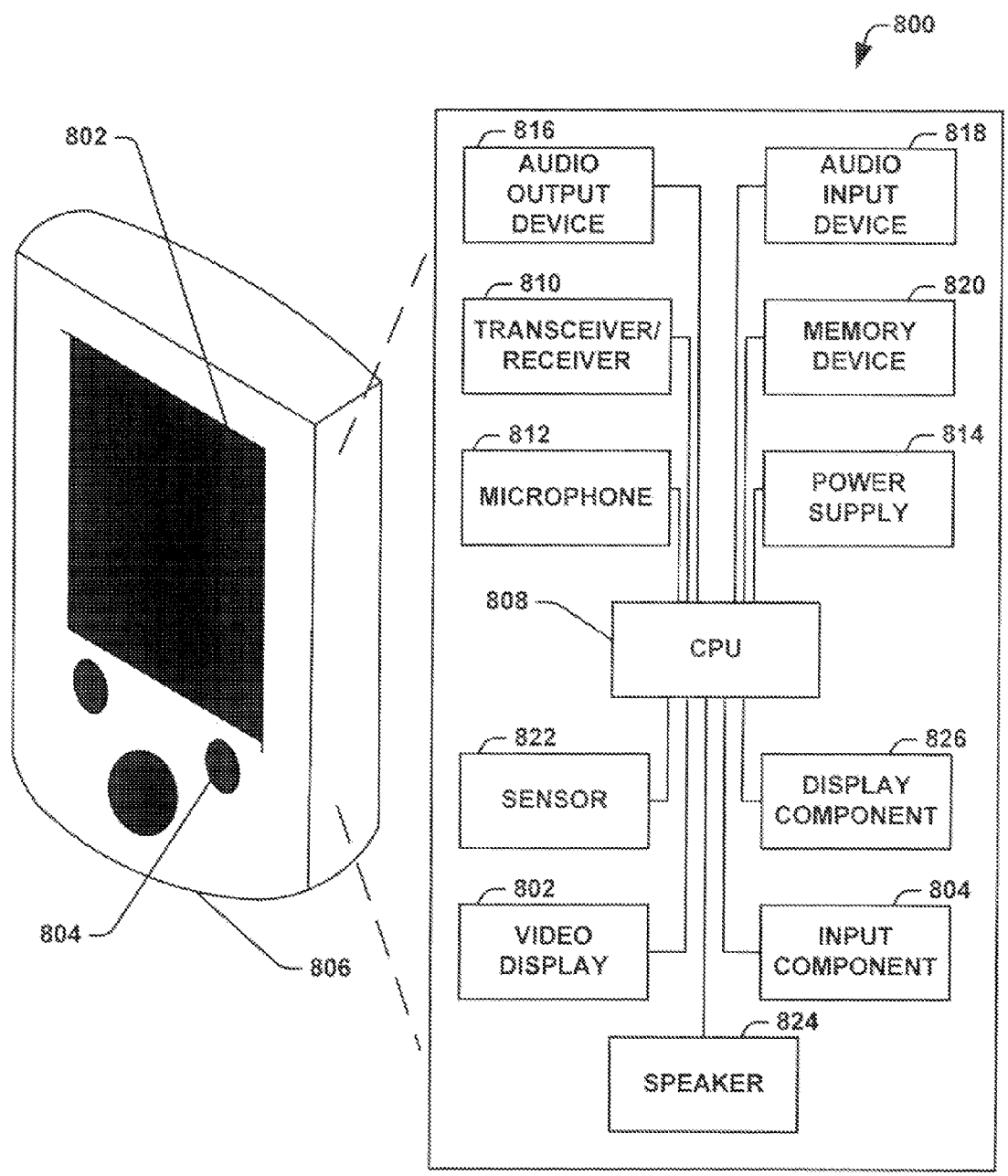
FIG. 8 is an exemplary electronic device comprising a memory device such as that of FIG. 7, configured to program or erase one or more memory cells on a wordline of a memory array, for example, using the singular program verify (SPV) method of FIG. 6, in accordance with another aspect of the present invention.

Assume for the sake of the following method discussion and the exemplary memory device embodiments 700 of FIGS. 7 and 800 of FIG. 8, a dual-element nitride storage flash (complementary element-pair) four-level per bit or element flash memory cell and wordline similar to that of FIGS. 1A and 1B with L1 representing a blank or erased state, and L4 representing the highest level similar to the levels of FIGS. 2A and 2B. It should be appreciated that method 600 will work for any erase and program level assignments and Vt distribution polarities of single and dual-element MLB memory cells or bits, and such variations are contemplated as falling within the scope of the present invention.

The singular program verify (SPV) method 600 of FIG. 6 starts at 602, wherein, initially one or more unprogrammed memory cells (e.g., dual-element cells 101-104 of FIG. 1A, 150 of FIG. 1B) may be provided on a selected wordline (e.g., WL 106 of FIG. 1A, or WL 1, WL 2 of FIGS. 4B, 4C) to be programmed or erased.

At 610, a threshold voltage Vt distribution, similar to Vt distribution 440 of FIG. 4B, is measured on the unprogrammed memory cells on a single wordline, such as WL 1 of FIG. 4B.

At 620, the average threshold voltage Vt(avg) 448 of the Vt measurements is computed from the Vt distribution 420 along the single wordline 106. For example, one typical Vt(avg) 448 may be about 3.1 volts.

At 630, one of two possible actions may then take place based on the computed or otherwise determined average threshold voltage Vt(avg):

1) one or more of the memory cells of the selected wordline is programmed to a predefined program level (e.g., L2, L3, L4) uniquely associated with the predetermined average threshold voltage Vt(avg) uniquely associated with the selected wordline (e.g., WL 1 of FIG. 4B, or WL 106 of FIG. 1A), or
2) one or more of the memory cells of the selected wordline is erased to the predetermined average threshold voltage Vt(avg) (e.g., L1, Vt(avg)=3.1V).

Thereafter, at 670 the SPV method 600 ends, wherein another wordline of unprogrammed memory cells may be selected and programmed or erased in accordance with the SPV method 600 of the present invention.

Alternately, at 620, a maximum Vt such as Vt(max) 444 of WL 1 of FIG. 4B may be determined based on the Vt distribution 420 along the single wordline 106.

Then, alternately at 630, one of two possible actions may take place based on the determined Vt maximum Vt(max):

1) one or more of the memory cells of the selected wordline is programmed to a predefined program level (e.g., L2, L3, L4) uniquely associated with the determined Vt maximum Vt(max) uniquely associated with the selected wordline (e.g., WL 1 of FIG. 4B, or WL 106 of FIG. 1A), or
2) one or more of the memory cells of the selected wordline is erased to a Vt level (e.g., L1) relative to (or offset from) the determined Vt maximum Vt(max) (e.g., Vt(max) =3.6V).

By programming or erasing the memory cells of a selected wordline according to a predetermined average threshold voltage (or a predetermined singular program verify level relative to a maximum Vt) uniquely associated with the selected wordline, it is intended to achieve a more representative program verify level for more accurately programming or erasing the memory cells of the selected wordline with reduced charge loss and improved data reliability over the life of the memory cells.

FIG. 7 illustrates an exemplary memory device 700 comprising a threshold voltage distribution measuring component 730 and an average threshold voltage determining component 740, the memory device 700 configured to program or erase one or more memory cells 710a (e.g., dual-element cells 101-104 of FIG. 1A, or 150 of FIG. 1B) on a selected wordline 725a (e.g., WL 106 of FIG. 1A, or WL 1, WL 2 of FIGS. 4B, 4C) of a plurality of wordlines 725 of a memory array 710 based on an average threshold voltage 750 uniquely associated with the selected wordline 725a of the memory array 710, in accordance with the singular program verify (SPV) method (e.g., method 600 of FIG. 6) of the present invention.

For example, memory array 710 comprises one or more unprogrammed memory cells 710a on the selected wordline 725a to be programmed or erased, wherein the memory cells 710a associated with the wordline 725a.

Optionally, the memory device is also configured to select the wordline 725a from among a plurality of wordlines 725, for example, using a wordline decoder 720.

The threshold voltage distribution measuring component 730 is configured to initially measure a threshold voltage Vt (e.g., Vt distribution 735, 440 of FIG. 4B) uniquely associated with the selected wordline 725a for each of the one or more memory cells 710a on the selected wordline 725a.

The average threshold voltage determining component 740 is configured to determine the average threshold voltage Vt(avg) 750 (e.g., Vt(avg) 448 of FIG. 4B), uniquely associated with the selected wordline 725a based on the measured threshold voltages 735.

Thus, the memory device 700 is configured to program or erase one or more memory cells 710a on a wordline 725a of a memory array 710, applying the method 600, for example, comprising:

providing one or more unprogrammed memory cells 710a on a selected wordline 725a to be programmed or erased, for example, the wordline 725a selected from among a plurality of wordlines 725 using a wordline decoder 720;

measuring a threshold voltage (Vt) using the Vt distribution measuring component 730, the measured Vt's uniquely associated with the selected wordline 725a for each of the one or more memory cells 710a on the selected wordline 725a;

determining an average threshold voltage Vt(avg) 750 uniquely associated with the selected wordline 725a based on the measured threshold voltages 735 using the average threshold voltage determining component 740;

programming one or more of the memory cells 710a of the selected wordline 725a to a predefined program level (e.g., L2, L3, L4) uniquely associated with a predetermined average threshold voltage Vt(avg) 750 uniquely associated with the selected wordline 725a; or erasing one or more of the memory cells 710a of the selected wordline 725a to the predetermined average threshold voltage Vt(avg) 750.

Alternately, the memory device 700 may also be configured for determining a program verify level (SPV, SPV 446 of FIG. 4B) uniquely associated with the selected wordline 725a and the determined average threshold voltage Vt(avg) 750; and programming one or more of the memory cells 710a of the selected wordline 725a to a predefined program level (e.g., L2, L3, L4) uniquely associated with the determined program verify level (SPV, SPV 446 of FIG. 4B) uniquely associated with the selected wordline 725a; or erasing one or more of the memory cells 710a of the selected wordline 725a to the determined program verify level (SPV, SPV 446 of FIG. 4B).

As used in this application, the terms "component," "module," "system", "interface" and the like are generally intended to refer to a computer-related entity, either hardware such as a circuit, a combination of hardware and software, software, or software in execution. For example, a component may be, but is not limited to being, a process running on a processor, a processor, an object, an executable, a thread of execution, a program, and/or a computer such as an embedded processor. By way of illustration, both an application running on a controller and the controller can be a component. One or more components may reside within a process and/or thread of execution and a component may be localized on one computer and/or distributed between two or more computers.

FIG. 8 illustrates an exemplary electronic device 800 comprising a memory device 820 such as memory device 700 of FIG. 7, configured to program or erase one or more memory cells on a wordline of a memory array, for example, using the singular program verify (SPV) method 600 of FIG. 6, in accordance with another aspect of the present invention.

For example, FIG. 8 illustrates an exemplary (portable) electronic device, such as a communications device or Personal Data Assistant (PDA) 800, for example, where one or more aspects of the disclosure herein may be implemented. The communication device 800 comprises a video display 802, one or more user input components 804, a housing 806, a CPU 808, a transceiver and/or receiver 810, a microphone 812, a power supply 814, an audio output device 816, an audio input 818, a memory device 820, various sensors 822, and speaker(s) 824. The memory device 820 of the communication device 800 operatively coupled to the CPU 808 and configured to receive data from and send data to the CPU 808, the memory comprising, for example, a memory array, a threshold voltage measuring component, and an average threshold voltage determining component, the memory configured to program or erase one or more memory cells on a selected wordline of the memory array as described herein.

The one or more user input components 804 can include a keypad, buttons, dials, pressure keys, and the like. The video display 802 can be a liquid crystal display, a plasma display, an LED display, and the like, for visually displaying information. The CPU 808 can be configured to communicate with the audio input device 818, the audio output device 816 and a display component 826. The display component 826 can be separate and distinct from the video display 802. The CPU 808 can execute control functions based on inputs from the user, entered using the one or more user input components 804, for example. Based on those inputs, for example the display component can display a graph, a photo, a map, a chart, a video, and the like. The communication device 800 can also be configured to output data as an audio signal, for example a song, a message, a warning sound, various tones, recordings, etc.

The communication device 800 can be configured to communicate with other electronic devices, for example computers, cell phones, other PDAs, and the like.

The communication device 800 can also be configured to (wirelessly) transmit and/or receive data. This is done utilizing the transmitter/receiver 810 to either transmit or receive data. Additionally, sensors 822 can be utilized to sense data external to the PDA 800, for example, temperatures, radiation levels, pressures, and the like. It will be appreciated that the memory device comprising a memory array, a threshold voltage measuring component, and an average threshold voltage determining component, the memory configured to program or erase one or more memory cells on a selected wordline of the memory array of a flash memory device described herein, can similarly be implemented in cell phones, laptops, computers, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of programming or erasing one or more memory cells on a wordline of a memory array, the method comprising:

providing one or more unprogrammed memory cells on a selected wordline to be programmed or erased;

initially measuring a threshold voltage (Vt) uniquely associated with the selected wordline for each of the one or more memory cells on the selected wordline;

determining an average threshold voltage Vt(avg) uniquely associated with the selected wordline based on the measured threshold voltages, before programming or erasing the one or more memory cells; and programming one or more of the memory cells of the selected wordline to a predefined program level uniquely associated with the determined average threshold voltage Vt(avg) uniquely associated with the selected wordline; or erasing one or more of the memory cells of the selected wordline to the determined average threshold voltage Vt(avg).

2. The method of claim 1, wherein the one or more memory cells comprise multi-level flash memory cells, individually comprising element-pairs having two physical bits per memory cell and two or more program levels and a blank level, the levels comprising three or more data levels corresponding to three or more threshold voltages.

3. The method of claim 1, wherein the one or more memory cells comprise multi-level memory cells having two or more of the predefined program levels.

4. The method of claim 3, wherein determining the average threshold voltage Vt(avg) uniquely associated with the selected wordline based on the measured threshold voltages, comprises:

determining an average threshold voltage uniquely associated with the selected wordline based on the measured threshold voltage of each memory cell for the selected wordline, comprising:
a) selecting a wordline to be programmed or erased;
b) selecting one or more of the unprogrammed memory cells on the selected wordline to be programmed or erased;
c) measuring a threshold voltage (Vt) for each memory cell on the selected wordline; and
d) determining an average threshold voltage uniquely associated with the selected wordline by averaging the measured threshold voltages uniquely associated with the selected wordline.

5. The method of claim 1, wherein the predefined program level uniquely associated with the selected wordline comprises one of a plurality of program levels utilized by the one or more memory cells, and wherein the plurality of program levels individually comprise a predetermined voltage offset from the determined average threshold voltage.

6. The method of claim 5, wherein the predefined program level is applied to each memory cell during a program verify operation of the memory array.

7. The method of claim 5, wherein programming one or more of the memory cells of the selected wordline to the predefined program level uniquely associated with the determined average threshold voltage Vt(avg) uniquely associated with the selected wordline, comprises:
a) selecting a wordline to be programmed;
b) selecting one or more of the unprogrammed memory cells on the selected wordline to be programmed;
c) selecting a program level from the plurality of program levels individually comprising a respective program voltage; and
d) applying pulses of the program voltage to the one or more memory cells until each of the one or more memory cells generally correspond to the selected program level for the selected wordline.

8. The method of claim 1, wherein determining the average threshold voltage Vt(avg) uniquely associated with the selected wordline based on the measured threshold voltages, comprises:

averaging the measured threshold voltages (Vt) uniquely associated with the selected wordline for each of the one or more memory cells on the selected wordline.

9. A method of programming or erasing one or more memory cells on a wordline of a memory array, the method comprising:

providing one or more unprogrammed memory cells on a selected wordline to be programmed or erased; and programming one or more of the memory cells of the selected wordline to a predefined program level uniquely associated with the determined average threshold voltage Vt(avg) uniquely associated with the selected wordline, comprising:

programming one or more of the memory cells to the predefined program level offset from the predetermined average threshold voltage Vt(avg) uniquely associated with the selected wordline, until each memory cell generally corresponds to the respective predefined program level.

10. The method of claim 9, wherein erasing one or more of the memory cells of the selected wordline to the predetermined average threshold voltage Vt(avg), comprises:

erasing one or more memory cells of the selected wordline to the predetermined average threshold voltage Vt until each of the one or more memory cells generally correspond to the average threshold voltage Vt for the selected wordline.

11. A method of programming or erasing one or more memory cells on a wordline of a memory array, the method comprising:

providing one or more unprogrammed memory cells on a selected wordline to be programmed or erased;

measuring a threshold voltage (Vt) uniquely associated with the selected wordline for each of the one or more memory cells on the selected wordline;

determining an average threshold voltage Vt(avg) uniquely associated with the selected wordline based on the measured threshold voltages;

determining a program verify level uniquely associated with the selected wordline and the determined average threshold voltage Vt(avg); and programming one or more of the memory cells of the selected wordline to a predefined program level uniquely associated with the determined program verify level uniquely associated with the selected wordline; or erasing one or more of the memory cells of the selected wordline to the determined program verify level.

12. The method of claim 11, wherein the predefined program verify level comprises one of a program verify voltage and a program verify current, and wherein the determined program verify level comprises one of an average program verify voltage and an average program verify current.

13. The method of claim 11, wherein the one or more memory cells comprise multi-level flash memory cells, comprising element-pairs individually having two or more program levels and a blank level, the levels comprising three or more data levels corresponding to three or more threshold voltages.

14. The method of claim 13, wherein the determined program verify level is used for verifying one of the three or more threshold voltages and data levels of each memory cell during a program verify operation.

15. The method of claim 11, wherein the one or more memory cells comprise multi-level memory cells having two or more predefined program levels.

16. The method of claim 15, wherein determining the program verify level uniquely associated with the selected wordline and the determined average threshold voltage Vt(avg), comprises:

a) selecting a wordline to be programmed or erased;

b) selecting one or more of the unprogrammed memory cells on the selected wordline to be programmed or erased;

c) measuring a threshold voltage (Vt) for each memory cell on the selected wordline; and d) determining an average threshold voltage uniquely associated with the selected wordline by averaging the measured threshold voltages uniquely associated with the selected wordline.

e) determining a program verify level uniquely associated with the selected wordline and the determined average threshold voltage based on a predetermined voltage offset from the determined average threshold voltage.

17. The method of claim 16, wherein programming one or more of the memory cells to the predefined program level relative to the determined program verify level for the selected wordline, comprises:

a) selecting a program level from the two or more predefined program levels and a respective determined program voltage; and b) applying pulses of the program voltage to the one or more memory cells until each of the one or more memory cells generally correspond to the program voltage for the selected wordline.

18. The method of claim 11, wherein the predefined program level comprises one of a plurality of program levels utilized by the one or more memory cells.

19. The method of claim 11, wherein programming one or more of the memory cells of the selected wordline to the predefined program level uniquely associated with the determined program verify level uniquely associated with the selected wordline, comprises:

programming one or more of the memory cells to a predefined program level that is offset from the determined program verify level for the selected wordline, until each memory cell generally corresponds to the predefined program level, wherein the predefined program level comprises one of a plurality of program levels and respective threshold voltages having a respective offset from the predetermined average threshold voltage.

20. The method of claim 11, wherein erasing the one or more memory cells of the selected wordline to the determined program verify level, comprises:

erasing one or more of the memory cells of the selected wordline to the program verify level until each of the one or more memory cells generally correspond to the program verify level for the selected wordline.

21. A memory device, comprising:

a memory array comprising a multi-bit flash memory, comprising one or more unprogrammed memory cells on a selected wordline of the memory array, the multi-bit flash memory cells individually comprising element-pairs having two physical bits per memory cell and two or more program levels and a blank level per memory cell, the levels comprising three or more data levels corresponding to three or more threshold voltages;

a threshold voltage measuring component configured to measure a threshold voltage (Vt) uniquely associated with the selected wordline for the one or more memory cells on the selected wordline; and an average threshold voltage determining component configured to determine an average threshold voltage Vt(avg) uniquely associated with the selected wordline based on the measured threshold voltages on the selected wordline of the memory array;

wherein the memory device is configured to program or erase the one or more memory cells on the selected wordline of the memory array;

wherein the memory device is configured to
program one or more of the memory cells of the selected wordline to a predefined program level uniquely associated with the determined average threshold voltage Vt(avg) uniquely associated with the selected wordline; or erase one or more of the memory cells of the selected wordline to the determined average threshold voltage Vt(avg).

22. The memory device of claim 21, wherein the predefined program level comprises one of a plurality of program levels utilized by the one or more memory cells, and wherein the plurality of program levels individually comprise a predetermined voltage offset from the determined average threshold voltage.

23. An electronic device, comprising:

a user input configured to allow a user to input data;

a user output configured to output data to a user;

a central processing unit (CPU) operatively coupled to the user input and the user output and configured to receive and process the user input and to output the user output; and a memory operatively coupled to the CPU and configured to receive data from and send data to the CPU, the memory comprising a memory array, a threshold voltage measuring component, and an average threshold voltage determining component, the memory configured to program or erase one or more memory cells on a selected wordline of the memory array, wherein the memory, comprises:

a memory array;

a threshold voltage measuring component configured to measure a threshold voltage (Vt) uniquely associated with a selected wordline for one or more memory cells on the selected wordline; and an average threshold voltage determining component configured to determine an average threshold voltage Vt(avg) uniquely associated with the selected wordline based on the measured threshold voltages on the selected wordline of the memory array; and wherein the memory is configured to
program one or more of the memory cells of the selected wordline to a predefined program level uniquely associated with the determined average threshold voltage Vt(avg) uniquely associated with the selected wordline; or erase one or more of the memory cells of the selected wordline to the determined average threshold voltage Vt(avg).

24. The device of claim 23, the electronic device comprising at least one of a communication device, Personal Data Assistant (PDA), cell phone, memory stick, flash drive device, video camcorder, voice recorder, USB flash drive, fax machine, flash memory, laptop, computer, scanner, MP3player, digital camera, home video game console, hard drive and memory card.

25. The device of claim 23, wherein the one or more memory cells of the memory array comprise multi-level flash memory cells comprising element-pairs, individual memory elements of the element-pairs having two or more program levels and a blank level, the levels comprising three or more data levels corresponding to three or more threshold voltages.

* * * * *